United States Patent [19]

Martin et al.

[11] Patent Number: 5,798,647
[45] Date of Patent: Aug. 25, 1998

[54] DIAGNOSTIC TEST CONTROLLER APPARATUS

[75] Inventors: Gregory A. Martin, Waterford; Ray E. Bussard, Westland, both of Mich.

[73] Assignee: Chrysler Corporation, Auburn Hills, Mich.

[21] Appl. No.: 643,649

[22] Filed: May 6, 1996

[51] Int. Cl.$^6$ .................................................. G01R 31/00
[52] U.S. Cl. ........................... 324/503; 364/424.038; 73/118.1
[58] Field of Search ........................ 324/503, 538, 324/539, 73.1, 542; 364/424.038, 551.01; 73/118.1; 439/502

[56] References Cited

U.S. PATENT DOCUMENTS

| | | | |
|---|---|---|---|
| 4,690,475 | 9/1987 | McElroy | 439/502 |
| 4,884,033 | 11/1989 | McConchie, Sr. | 324/503 |
| 5,214,582 | 5/1993 | Gray | 364/424.038 |
| 5,461,908 | 10/1995 | Armstrong | 324/503 |
| 5,530,360 | 6/1996 | Kerchaert | 324/503 |

*Primary Examiner*—Christine K. Oda
*Attorney, Agent, or Firm*—Roland A. Fuller, II

[57] ABSTRACT

A diagnostic test apparatus for simulating pin open circuit, pin short to ground and pin shorted-to-voltage fault conditions at each pin of each connector of an engine controller module (ECM). The apparatus includes a parallel port coupled to a demultiplexer circuit. The outputs of the demultiplexer circuit drive a plurality of relay drivers, which each, in turn, control independently a single relay coupled between one particular pin of an ECM connector and its associated circuit line on the vehicle wiring harness, when the apparatus is coupled in line between the ECM connector and the vehicle wiring harness. The apparatus may be controlled by an external computer such that the three above-mentioned fault conditions may be initiated automatically. The parallel port of the apparatus is connected to an external computer, preferably a personal computer, to allow the technician to initiate the fault conditions without requiring the technician to remain inside the vehicle to actuate any switches or other like devices on the apparatus 10. The apparatus thus allows three different fault conditions to be simulated at each pin of the ECM quickly and easily through the use of an external computer. Any fault information recorded by the ECM may be read via a separate serial communications interface between the computer and the ECM and subsequently cleared by the computer. The apparatus thus enables the diagnostics of a vehicle's ECM to be checked quickly and accurately to ensure the ECM recognizes various fault conditions.

15 Claims, 4 Drawing Sheets

FIG. 5.

DIAGNOSTIC TEST CONTROLLER APPARATUS

1. TECHNICAL FIELD

This invention relates to diagnostic test equipment, and more particularly to an automated diagnostic test controller apparatus for simulating fault conditions in the wiring harness of a vehicle between the engine controller and the engine of the vehicle to insure that the engine controller is properly sensing various fault conditions.

2. DISCUSSION

Diagnostic test equipment is used in a variety of applications, one of which is checking the integrity of various electrical components used in motor vehicle applications. In particular, one important area of integrity testing is in connection with the engine controller module ("ECM") of a motor vehicle.

Prior developed systems have required a rather laborious procedure and/or expensive test equipment for checking the integrity of a vehicle's ECM to insure that the ECM properly detects various fault conditions that may arise as a result of one or more conductors or connectors of the vehicle's wiring harness experiencing an open circuit condition, a short-to-ground condition, or a short to some voltage source. Present equipment and procedures typically required for testing an ECM require one or more of the following steps and/or pieces of equipment:

1. obtaining an interrogator box;
2. obtaining appropriate software for use on an external computer to control the interrogator box;
3. obtaining appropriate software for making a suitable chip to allow communication with the interrogator box;
4. making the above-mentioned chip;
5. finding a DRBII;
6. obtaining a break out box with switchable connections;
7. obtaining a volt meter;
8. obtaining shorting wire for use of the breakout box;
9. running the needed integrity tests by getting in and out of the vehicle and setting the individual faults to be tested for (i.e., open circuit, short circuit, etc.) on the interrogator box;
10. recording the result of each test on a corresponding test sheet or log by hand;
11. putting away the test equipment; and
12. writing a test report.

Often times the above procedures can take up to four hours or more of time with the above-listed equipment. Additionally, the test report often takes several hours to manually write up after the integrity testing is completed. Compounding this problem is that when a new version of software is released or new calibration is released for the ECM, the various integrity diagnostics have to be re-run. This process may occur many times in the development of new power train electronics and results in time consuming and inefficient use of human resources and equipment, as well as adding to the overall cost of manufacture of the vehicle.

Accordingly, it would be highly desirable to provide a diagnostic test apparatus which expedites the various integrity tests that need to be executed to verify the integrity of an ECM of a vehicle.

It would also be highly desirable to provide a diagnostic test apparatus that greatly simplifies the above-listed steps needed to perform the necessary integrity checks and which reduces the number of component pieces of equipment needed to carry out the tests.

It would further be highly desirable to provide a diagnostic test apparatus which can accomplish the needed integrity checks in an automated fashion, within a relatively short period of time, for example within 1–2 hours, and which also records information automatically through the use of an external computer which may be readily coupled to an interface of the apparatus.

A new diagnostic test device such as described above would automate and expedite the execution of integrity tests needed to be performed on ECMs of motor vehicles and further increase the integrity of the testing procedure itself through increased repeatability and consistency. Such a device, through its ready interface with an external computer, could be used to run tests continuously and to repeat the various integrity tests quickly and easily if so desired. Such a device would allow integrity tests to be rerun quickly and easily should the software associated with the ECM be changed.

SUMMARY OF THE INVENTION

The above and other objects are accomplished by an automated diagnostic test controller apparatus in accordance with the preferred embodiments of the present invention. In one preferred embodiment the apparatus includes a housing having a parallel port adapted to be coupled via a suitable cable to a parallel port of a computer such as a personal computer. Within the housing is a demultiplexer circuit coupled to the parallel port which allows signals received from the external computer to be used, via the parallel port of the apparatus, to initiate various integrity tests. The outputs of the demultiplexer circuit are coupled to a plurality of first relays. Each of the first relays is independently coupled to a conductive element of a pair of test connectors suitable to be secured to the connector on the engine controller module ("ECM") and the connector of the wiring harness of the vehicle. In this manner each of the first relays is placed in series with an associated pin of the ECM connector and circuit line of the vehicle wiring harness.

In one preferred embodiment a second relay is included and coupled between the parallel port of the apparatus and each one of the first relays. In yet another preferred embodiment a third independent relay is included and is responsive to signals received at the parallel port of the apparatus. The third relay is also coupled in parallel to the second relay and to each one of the first relays.

In operation, a user selects a desired integrity test to be performed via the external computer and suitable software running on the external computer. Such tests may include a "pin open circuit" test in which each pin of the ECM connector is uncoupled from its associated circuit line (i.e., left "open circuited"), a "pin-to-ground" test in which each pin of the ECM connector is connected to ground, and a "pin-to-voltage" test in which each pin of the ECM is coupled to a positive voltage.

One or more of the above-mentioned tests may be performed by selectively energizing each of the first relays and the second relay. In one alternative embodiment additional tests may be performed by selectively energizing one of the first relays in addition to one or the other of the second and third relays.

In one preferred embodiment the first relays of the apparatus are selectively energizable, and the second relay is also selectively energizable, via suitable signals from the external computer supplied via the parallel port of the apparatus. When one selected first relay is energized while the second relay is de-energized, the pin of the ECM connector associated with the selected relay is left in an open circuit condition (i.e., left uncoupled from its associated circuit line of the vehicle wiring harness), thus simulating a pin-open-circuit fault condition to the ECM. When the second relay is energized while the selected first relay remains energized, the pin associated with the selected first relay is shorted to ground while the selected first relay and second relay remain energized, thus simulating a pin short-to-ground fault condition to the ECM.

In the embodiment of the apparatus which includes the third relay, when the first relay is energized and the second relay remains de-energized, the third relay may be used to short the pin of the ECM connector associated with the selected relay to a positive voltage source, thus simulating a pin short-to-voltage fault condition. When the third relay is de-energized, its presence has no effect on the operation of any one of the first relays or the second relay.

When the apparatus is used to check the integrity of an ECM and a wiring harness of a vehicle, one connector at a time is uncoupled from the ECM of the vehicle and the test connectors of the apparatus coupled to the connector of the ECM and the connector of the vehicle wiring harness to place the apparatus in series between the ECM and the connector of the vehicle wiring harness. The parallel port of the apparatus is coupled via a suitable cable to the parallel output of a computer such as a personal computer. Optionally, but preferably, a serial communications interface of the personal computer is also coupled to a serial communications interface which is typically included on the ECM of most vehicles.

At this point a user initiates software used to implement the various integrity tests and selects which particular test (i.e., pin open circuit, pin short-to-ground or pin short-to-voltage source) is to be executed. Signals from the personal computer's parallel port are transmitted to the parallel port of the apparatus and used to select various ones of the first relays of the apparatus to begin conducting the selected tests. When all of the selected integrity tests have been performed, the tests can be repeated if desired and/or any faults realized, which are recorded by the ECM, obtained and cleared by appropriate signals to the ECM via the serial communications interface cable coupled between the personal computer and the serial port of the ECM.

BRIEF DESCRIPTION OF THE DRAWINGS

FIG. 3 is a simplified block diagram of the internal components of the invention;

DETAILED DESCRIPTION OF THE PREFERRED EMBODIMENTS

Figure 1:
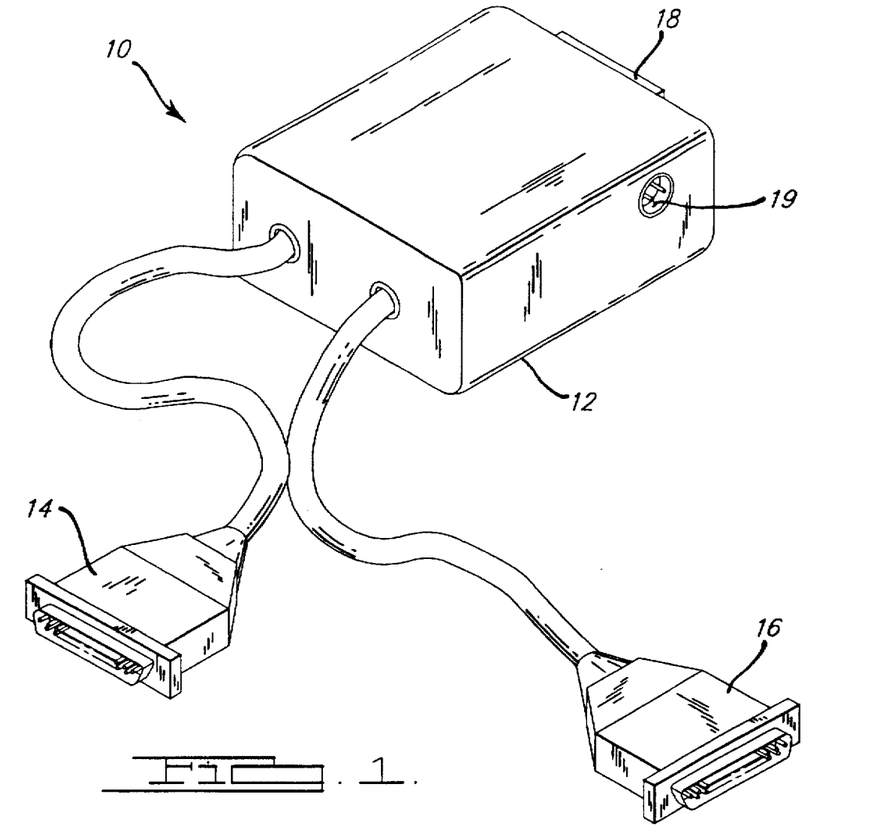
FIG. 1 is a perspective view of a diagnostic test controller apparatus in accordance with a preferred embodiment of the present invention.

Referring to FIG. 1, there is shown a diagnostic test apparatus 10 in accordance with a preferred embodiment of the present invention. The apparatus 10 generally includes a multi-piece housing 12, a first test connector 14, a second test connector 16 and a parallel port 18. The test connectors 14 and 16 are each standard 32 pin connectors and are each secured at the end of a short length of multi-conductor cable making the coupling of the connectors easy to accomplish. The parallel port 18 is preferably a Centronics® parallel port. It will be appreciated that the placement of the connectors 14 and 16 as well as the parallel port 18 could vary considerably, as could the configuration of the housing 12, as long as each of the connectors and the parallel port are readily accessible and allow the apparatus 10 to be quickly and easily coupled and uncoupled to the electronic controller module (hereinafter "ECM") of a vehicle. The apparatus 10 is preferably powered by a self-contained battery, although an optional power input 19 is illustrated for receiving power from an external source such as a 12 volt supply. It will be appreciated that the apparatus 10 could easily be adapted for use with an AC voltage source, if desired, provided suitable rectification circuitry is included.

Figure 2:
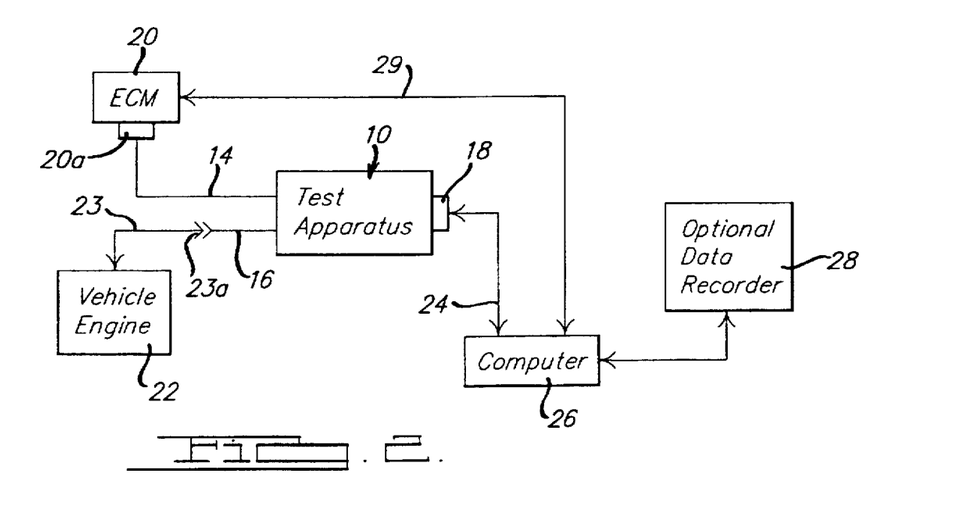
FIG. 2 is a simplified block diagram showing the apparatus coupled in series between an ECM of a motor vehicle and an engine of the vehicle and further illustrating the apparatus coupled to an external computer.

Referring to FIG. 2, the apparatus 10 is coupled in series between the connector 20a of the vehicle's ECM 20 and the connector 23a of the wiring harness 23 of the vehicle engine 22 via the test connectors 14 and 16, respectively. The parallel port 18 is coupled via a suitable cable 24 to the Centronics® parallel port of an external computer 26. The computer 26 may be any computer, such as a personal computer, which is widely available, relatively low in cost and familiar to many skilled and unskilled individuals. Optionally, a data recorder 28 may be coupled to the computer 26 to record test information provided by the test apparatus 10. The data recorder 28 could be a printer, a magnetic disc storage device, magnetic tape storage device, floppy disc drive, etc. Additionally, the computer 26 preferably is coupled to a serial port of the ECM 20 via a standard serial communications interface cable 29. The apparatus 10 is relatively compact so as to be readily handled by a technician, engineer, etc. and readily coupled and uncoupled between the ECM 20 connector 20a and the vehicle engine 22. Once coupled between the ECM 20 connector 20a and engine wiring harness 23, the apparatus 10 may be left unattended by the individual performing the test while the tests are initiated via the computer 26.

Referring to FIG. 3, a simplified block diagram of the apparatus 10 is shown. The apparatus 10, in addition to the parallel port 18, includes a demultiplexer circuit 30 capable of demultiplexing the input signal received at the parallel port into one of 32 different output signals. Each one of the 32 outputs of the demultiplexer 30 is used to drive one of a plurality of eight relay driver chips 32A–32H depending upon the particular signal received at the parallel port 18. Each of the relay drivers 32A–32H has four inputs associated with four outputs of the demultiplexer circuit 30, in addition to four outputs associated with four independent "A" relays 34. A ninth relay driver 32I is also included for driving a second or "B" relay 36 and a third or "C" relay 38, the functions of which will be described momentarily. It will therefore be appreciated that outputs 1–4 of the demultiplexer 30 are associated with relay driver 32A, outputs 5–8 of the demultiplexer 30 are associated with relay driver 32B, outputs 9–12 of demultiplexer 30 are associated with relay driver 32C, and so forth. Relay driver 32I is controlled directly by signals from the parallel port 18 without the need for demultiplexing by demultiplexer 30.

With further reference to FIG. 3, the first relay driver 32A has four outputs which are coupled to relays $34A_1$–$34A_4$. Each of the remaining relay drivers 32B–32H likewise have four outputs which are each coupled independently to independent relays such as relays $34A_1$–$34A_4$. Accordingly, a total of 32 independent relays (i.e. relays $34A_1$–$34A_{32}$) are controlled by eight relay drivers 32A–32H, with each relay driver driving four independent relays. For simplicity, only relays $34A_1$–$34A_4$ have been shown in the drawing of FIG. 3.

With further reference to FIG. 3, each of the relays $34A_1$–$34A_4$ is coupled to a positive voltage source 40. Each relay $34A_1$–$34A_4$ further has an input 42 which is coupled to the first test connector 14 and a second input 44 which is coupled to the second test connector 16. It will be appreciated, then, that each relay $34A_1$–$34A_4$ is coupled electrically in series between the test connectors 14 and 16.

With further reference to FIG. 3, each relay $34A_1$–$34A_{32}$ includes a third input 46 which is coupled in parallel to an input 36A of relay 36. An input 36B of relay 36 is tied to ground and an input 36C is not tied to any component (i.e. left in an "open" state). Relay 38 has an input 38A which is also tied in parallel to each input 46 of each one of relays 34A as well as to input 36A of relay 36. It will be appreciated that inputs 36A and 38A are also coupled in parallel to inputs 46 of each of the relays 34.

Figure 4:
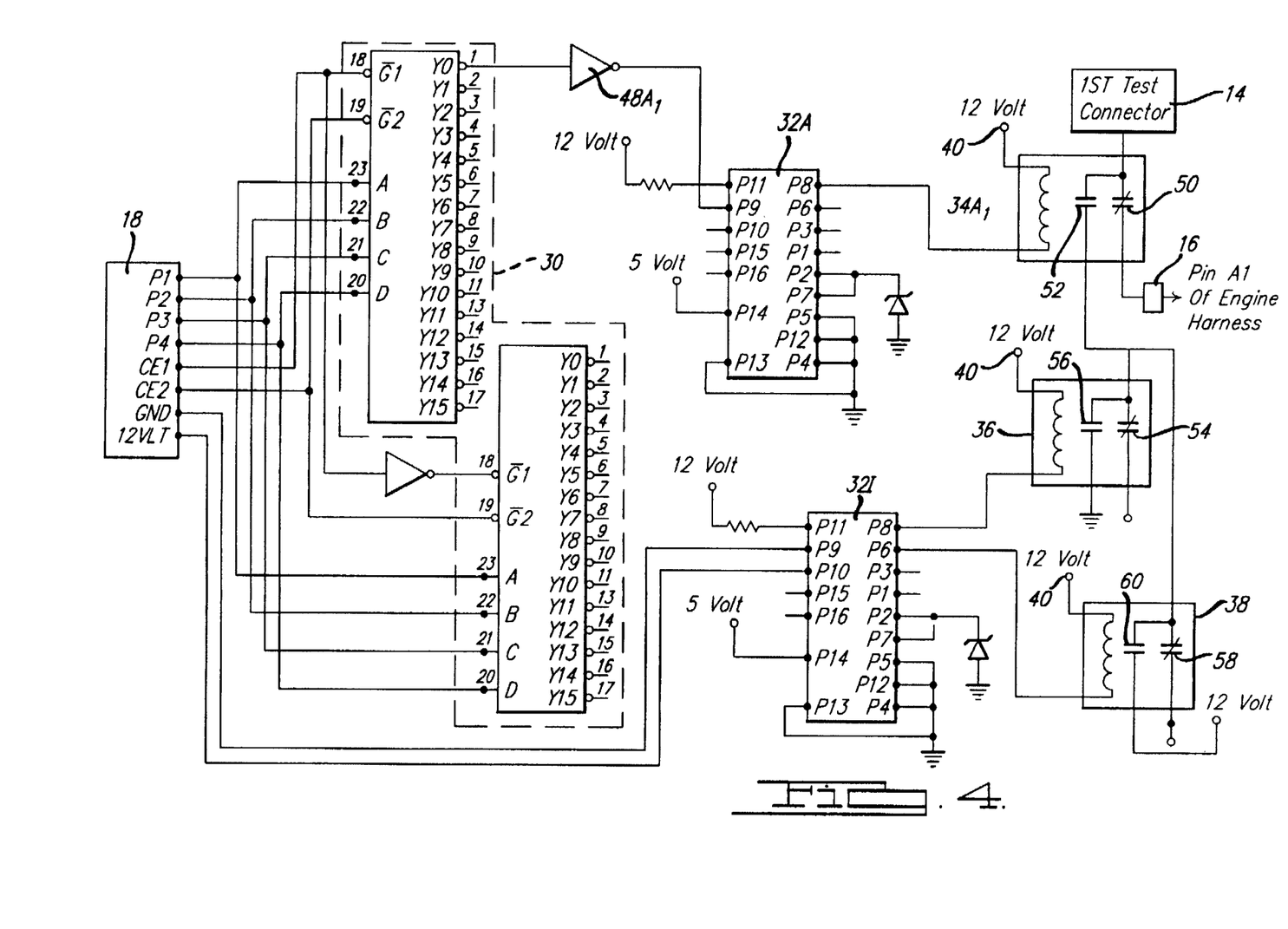
FIG. 4 is a simplified electrical schematic diagram of the apparatus illustrating one of the 32 first relays of the apparatus in addition to the second and third relays which, collectively, are used to implement the various integrity tests on the ECM connector.

Referring now to FIG. 4, a simplified electrical schematic diagram illustrating one of the relays 34 coupled to the second relay 36 and the third relay 38 is shown. The parallel port 18 of the apparatus 10 is coupled to the demultiplexer circuit 30, which is comprised of two 4-to-16 demultiplexer circuits bridged together to form an 8-to-32 demultiplexer circuit. Each one of the 32 outputs of the demultiplexer circuit 30 has an associated inverting amplifier 48 associated therewith which inverts the signal applied to its associated relay driver 32. As explained hereinbefore, each relay driver 32 has four control inputs and four control outputs, with each one of the control outputs independently driving one of the relays 34. Relay 36 and relay 38 are both controlled by relay driver 32I, which is in turn controlled directly by controlling the "GND" and "12 volt" lines of the parallel port 18.

In operation, once the apparatus 10 is connected in line between the ECM 20 and the vehicle engine wiring harness connector 23a, pin 1 of the ECM 20 may be tested by energizing relay $34A_1$. This is accomplished by a suitable signal from the external computer 26 to the parallel port 18 which includes a binary signal designating the first relay $34A_1$. This signal is demultiplexed by the demultiplexer circuit 30 to produce a signal at output port 1 of the demultiplexer 30. This signal energizes relay $34A_1$ which opens a normally closed contact 50 of the relay and closes a normally open contact 52.

With further reference to FIG. 4, if a short-to-ground test is to be performed, the second relay 36 is energized by a signal at the GND pin of the parallel port 18 which causes relay driver 32I to energize the second relay 36. When this happens a normally closed contact 54 of the relay 36 is opened and the normally opened relay 56 thereof is closed. This causes pin 1 of the ECM 20 to be shorted to ground. During this time relay 38 is kept in a de-energized state. To perform a pin-open-circuit test on pin 1, the second relay 36 is left in a de-energized state as is the third relay 38. This causes pin 1 of the ECM 20 to be placed in an open circuit condition.

To short pin 1 of the ECM 20 to a positive voltage, the third relay 38 is energized by relay driver 32I via a signal from the "plus 12 VLT" line of the parallel port 18, provided by the external computer 26 (FIG. 2). When relay 38 is energized, a normally closed contact thereof 58 is opened while a normally opened contact 60 thereof is closed. This is done with the second relay 36 in a de-energized state while relay $34A_1$ remains energized. This causes pin 1 of the ECM 20 to be shorted through relay contacts 52 and 60 to a +12 volt source. It will be appreciated, then, that at least three independent fault conditions can be simulated at each pin of the ECM 20: pin short-to-ground, pin open circuit and pin shorted to a positive voltage source. As can also be appreciated from the drawing of FIG. 4, only a relatively few components are needed to accomplish the above-mentioned tests. There is no need for a technician or other like individual to remain in the vehicle and manipulate individual switches of the apparatus. The independent above-mentioned tests are initiated at the external computer 26 by the technician and may even be run automatically in sequence, one after another, for each pin of the ECM 20 while the technician performs other tasks. The following truth tables illustrate the signals necessary at each pin of the parallel port 18 to implement each of the three above-described tests on each pin of the ECM 20 connector 20a. It will be understood that "0" represents a logic low level signal and "1" represents a logic high level signal:

TABLE 1

Pin Open Circuit Truth Table
Automated Circuit Tester System Schematics and Tables
Open Circuit Truth Table

| Description | 12 Vlt | GND | CE2 | CE1 | P4 | P3 | P2 | P1 |
|---|---|---|---|---|---|---|---|---|
| Pin 1 Open | 0 | 0 | 0 | 0 | 0 | 0 | 0 | 0 |
| Pin 2 Open | 0 | 0 | 0 | 0 | 0 | 0 | 0 | 1 |
| Pin 3 Open | 0 | 0 | 0 | 0 | 0 | 0 | 1 | 0 |
| Pin 4 Open | 0 | 0 | 0 | 0 | 0 | 0 | 1 | 1 |
| Pin 5 Open | 0 | 0 | 0 | 0 | 0 | 1 | 0 | 0 |
| Pin 6 Open | 0 | 0 | 0 | 0 | 0 | 1 | 0 | 1 |
| Pin 7 Open | 0 | 0 | 0 | 0 | 0 | 1 | 1 | 0 |
| Pin 8 Open | 0 | 0 | 0 | 0 | 0 | 1 | 1 | 1 |
| Pin 9 Open | 0 | 0 | 0 | 0 | 1 | 0 | 0 | 0 |
| Pin 10 Open | 0 | 0 | 0 | 0 | 1 | 0 | 0 | 1 |
| Pin 11 Open | 0 | 0 | 0 | 0 | 1 | 0 | 1 | 0 |
| Pin 12 Open | 0 | 0 | 0 | 0 | 1 | 0 | 1 | 1 |
| Pin 13 Open | 0 | 0 | 0 | 0 | 1 | 1 | 0 | 0 |
| Pin 14 Open | 0 | 0 | 0 | 0 | 1 | 1 | 0 | 1 |
| Pin 15 Open | 0 | 0 | 0 | 0 | 1 | 1 | 1 | 0 |
| Pin 16 Open | 0 | 0 | 0 | 0 | 1 | 1 | 1 | 1 |
| Pin 17 Open | 0 | 0 | 0 | 1 | 0 | 0 | 0 | 0 |
| Pin 18 Open | 0 | 0 | 0 | 1 | 0 | 0 | 0 | 1 |
| Pin 19 Open | 0 | 0 | 0 | 1 | 0 | 0 | 1 | 0 |
| Pin 20 Open | 0 | 0 | 0 | 1 | 0 | 0 | 1 | 1 |
| Pin 21 Open | 0 | 0 | 0 | 1 | 0 | 1 | 0 | 0 |
| Pin 22 Open | 0 | 0 | 0 | 1 | 0 | 1 | 0 | 1 |
| Pin 23 Open | 0 | 0 | 0 | 1 | 0 | 1 | 1 | 0 |
| Pin 24 Open | 0 | 0 | 0 | 1 | 0 | 1 | 1 | 1 |
| Pin 25 Open | 0 | 0 | 0 | 1 | 1 | 0 | 0 | 0 |
| Pin 26 Open | 0 | 0 | 0 | 1 | 1 | 0 | 0 | 1 |
| Pin 27 Open | 0 | 0 | 0 | 1 | 1 | 0 | 1 | 0 |
| Pin 28 Open | 0 | 0 | 0 | 1 | 1 | 0 | 1 | 1 |
| Pin 29 Open | 0 | 0 | 0 | 1 | 1 | 1 | 0 | 0 |
| Pin 30 Open | 0 | 0 | 0 | 1 | 1 | 1 | 0 | 1 |
| Pin 31 Open | 0 | 0 | 0 | 1 | 1 | 1 | 1 | 0 |
| Pin 32 Open | 0 | 0 | 0 | 1 | 1 | 1 | 1 | 1 |

TABLE 2

Pin Short-To-Ground Truth Table
Short to Ground Truth Table

| Description | 12 Vlt | GND | CE2 | CE1 | P4 | P3 | P2 | P1 |
|---|---|---|---|---|---|---|---|---|
| Pin 1 Short GND | 0 | 1 | 0 | 0 | 0 | 0 | 0 | 0 |
| Pin 2 Short GND | 0 | 1 | 0 | 0 | 0 | 0 | 0 | 1 |

TABLE 2-continued

Pin Short-To-Ground Truth Table
Short to Ground Truth Table

| Description | 12 Vlt | GND | CE2 | CE1 | P4 | P3 | P2 | P1 |
|---|---|---|---|---|---|---|---|---|
| Pin 3 Short GND | 0 | 1 | 0 | 0 | 0 | 0 | 1 | 0 |
| Pin 4 Short GND | 0 | 1 | 0 | 0 | 0 | 0 | 1 | 1 |
| Pin 5 Short GND | 0 | 1 | 0 | 0 | 0 | 1 | 0 | 0 |
| Pin 6 Short GND | 0 | 1 | 0 | 0 | 0 | 1 | 0 | 1 |
| Pin 7 Short GND | 0 | 1 | 0 | 0 | 0 | 1 | 1 | 0 |
| Pin 8 Short GND | 0 | 1 | 0 | 0 | 0 | 1 | 1 | 1 |
| Pin 9 Short GND | 0 | 1 | 0 | 0 | 1 | 0 | 0 | 0 |
| Pin 10 Short GND | 0 | 1 | 0 | 0 | 1 | 0 | 0 | 1 |
| Pin 11 Short GND | 0 | 1 | 0 | 0 | 1 | 0 | 1 | 0 |
| Pin 12 Short GND | 0 | 1 | 0 | 0 | 1 | 0 | 1 | 1 |
| Pin 13 Short GND | 0 | 1 | 0 | 0 | 1 | 1 | 0 | 0 |
| Pin 14 Short GND | 0 | 1 | 0 | 0 | 1 | 1 | 0 | 1 |
| Pin 15 Short GND | 0 | 1 | 0 | 0 | 1 | 1 | 1 | 0 |
| Pin 16 Short GND | 0 | 1 | 0 | 0 | 1 | 1 | 1 | 1 |
| Pin 17 Short GND | 0 | 1 | 0 | 1 | 0 | 0 | 0 | 0 |
| Pin 18 Short GND | 0 | 1 | 0 | 1 | 0 | 0 | 0 | 1 |
| Pin 19 Short GND | 0 | 1 | 0 | 1 | 0 | 0 | 1 | 0 |
| Pin 20 Short GND | 0 | 1 | 0 | 1 | 0 | 0 | 1 | 1 |
| Pin 21 Short GND | 0 | 1 | 0 | 1 | 0 | 1 | 0 | 0 |
| Pin 22 Short GND | 0 | 1 | 0 | 1 | 0 | 1 | 0 | 1 |
| Pin 23 Short GND | 0 | 1 | 0 | 1 | 0 | 1 | 1 | 0 |
| Pin 24 Short GND | 0 | 1 | 0 | 1 | 0 | 1 | 1 | 1 |
| Pin 25 Short GND | 0 | 1 | 0 | 1 | 1 | 0 | 0 | 0 |
| Pin 26 Short GND | 0 | 1 | 0 | 1 | 1 | 0 | 0 | 1 |
| Pin 27 Short GND | 0 | 1 | 0 | 1 | 1 | 0 | 1 | 0 |
| Pin 28 Short GND | 0 | 1 | 0 | 1 | 1 | 0 | 1 | 1 |
| Pin 29 Short GND | 0 | 1 | 0 | 1 | 1 | 1 | 0 | 0 |
| Pin 30 Short GND | 0 | 1 | 0 | 1 | 1 | 1 | 0 | 1 |
| Pin 31 Short GND | 0 | 1 | 0 | 1 | 1 | 1 | 1 | 0 |
| Pin 32 Short GND | 0 | 1 | 0 | 1 | 1 | 1 | 1 | 1 |

TABLE 3

Pin Short-To-+12 V Truth Table
Short to +12 Volts Truth Table

| Description | 12 Vlt | GND | CE2 | CE1 | P4 | P3 | P2 | P1 |
|---|---|---|---|---|---|---|---|---|
| Pin 1 Short +12 V | 1 | 0 | 0 | 0 | 0 | 0 | 0 | 0 |
| Pin 2 Short +12 V | 1 | 0 | 0 | 0 | 0 | 0 | 0 | 1 |
| Pin 3 Short +12 V | 1 | 0 | 0 | 0 | 0 | 0 | 1 | 0 |
| Pin 4 Short +12 V | 1 | 0 | 0 | 0 | 0 | 0 | 1 | 1 |
| Pin 5 Short +12 V | 1 | 0 | 0 | 0 | 0 | 1 | 0 | 0 |
| Pin 6 Short +12 V | 1 | 0 | 0 | 0 | 0 | 1 | 0 | 1 |
| Pin 7 Short +12 V | 1 | 0 | 0 | 0 | 0 | 1 | 1 | 0 |
| Pin 8 Short +12 V | 1 | 0 | 0 | 0 | 0 | 1 | 1 | 1 |
| Pin 9 Short +12 V | 1 | 0 | 0 | 0 | 1 | 0 | 0 | 0 |
| Pin 10 Short +12 V | 1 | 0 | 0 | 0 | 1 | 0 | 0 | 1 |
| Pin 11 Short +12 V | 1 | 0 | 0 | 0 | 1 | 0 | 1 | 0 |
| Pin 12 Short +12 V | 1 | 0 | 0 | 0 | 1 | 0 | 1 | 1 |
| Pin 13 Short +12 V | 1 | 0 | 0 | 0 | 1 | 1 | 0 | 0 |
| Pin 14 Short +12 V | 1 | 0 | 0 | 0 | 1 | 1 | 0 | 1 |
| Pin 15 Short +12 V | 1 | 0 | 0 | 0 | 1 | 1 | 1 | 0 |
| Pin 16 Short +12 V | 1 | 0 | 0 | 0 | 1 | 1 | 1 | 1 |
| Pin 17 Short +12 V | 1 | 0 | 0 | 1 | 0 | 0 | 0 | 0 |
| Pin 18 Short +12 V | 1 | 0 | 0 | 1 | 0 | 0 | 0 | 1 |
| Pin 19 Short +12 V | 1 | 0 | 0 | 1 | 0 | 0 | 1 | 0 |
| Pin 20 Short +12 V | 1 | 0 | 0 | 1 | 0 | 0 | 1 | 1 |
| Pin 21 Short +12 V | 1 | 0 | 0 | 1 | 0 | 1 | 0 | 0 |
| Pin 22 Short +12 V | 1 | 0 | 0 | 1 | 0 | 1 | 0 | 1 |
| Pin 23 Short +12 V | 1 | 0 | 0 | 1 | 0 | 1 | 1 | 0 |
| Pin 24 Short +12 V | 1 | 0 | 0 | 1 | 0 | 1 | 1 | 1 |
| Pin 25 Short +12 V | 1 | 0 | 0 | 1 | 1 | 0 | 0 | 0 |
| Pin 26 Short +12 V | 1 | 0 | 0 | 1 | 1 | 0 | 0 | 1 |
| Pin 27 Short +12 V | 1 | 0 | 0 | 1 | 1 | 0 | 1 | 0 |
| Pin 28 Short +12 V | 1 | 0 | 0 | 1 | 1 | 0 | 1 | 1 |
| Pin 29 Short +12 V | 1 | 0 | 0 | 1 | 1 | 1 | 0 | 0 |
| Pin 30 Short +12 V | 1 | 0 | 0 | 1 | 1 | 1 | 0 | 1 |
| Pin 31 Short +12 V | 1 | 0 | 0 | 1 | 1 | 1 | 1 | 0 |
| Pin 32 Short +12 V | 1 | 0 | 0 | 1 | 1 | 1 | 1 | 1 |

Figure 5:
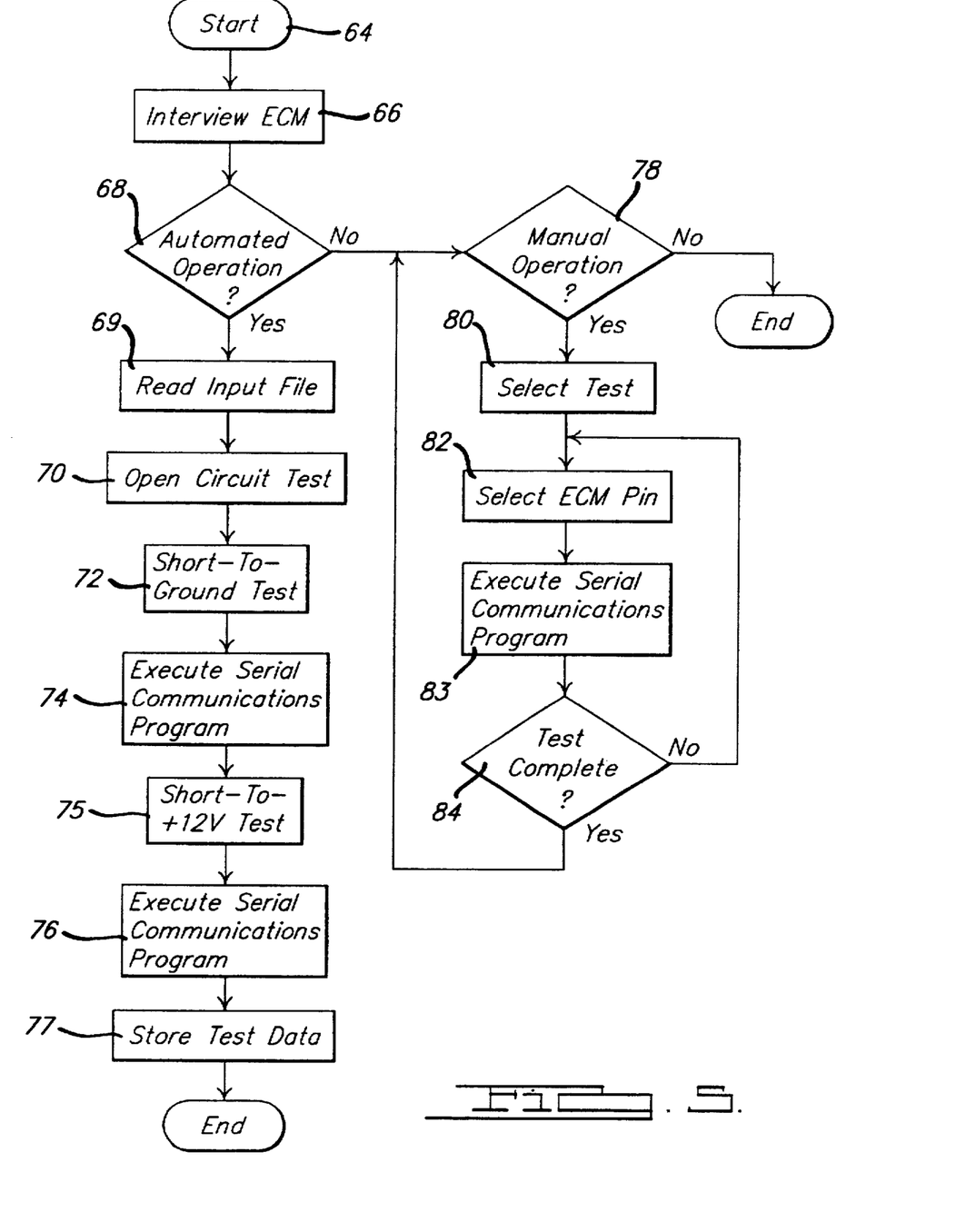
FIG. 5 is a simplified flow chart of a program used with an external computer to control the sequence of integrity tests performed by the apparatus of the present invention.

With reference now to FIG. 5, a simplified flow chart of a program for controlling the apparatus 10 is shown. The program is started, as indicated in block 64, from the external computer 26. Initially, an inquiry is made as to pertinent vehicle information such as the part no. of the ECM being tested, the vehicle identification no. (i.e., "VIN"), etc., as indicated in step 66. An inquiry is then made as to whether or not "automated operation" of the test sequence is desired, as indicated in step 68. The "automated operation" involves using the external computer 26 to automatically perform all of the above-described tests on each pin of the ECM connector 20a. Accordingly, if automated operation is requested, a user input file is read, as indicated at step 69, to obtain the time interval previously set for each test (e.g., one second), for each pin of the ECM 20. The open circuit test is then performed for each pin of the 32 pin connector 20a under test on the ECM 20 as indicated at step 70. When these tests are completed, the pin short-to-ground test is executed for each of the 32 pins, as indicated at step 72. The data obtained from the tests executed at steps 70 and 72 may be obtained by executing a serial communications program to interrogate the vehicle's ECM 20 to obtain and clear any fault information stored in the ECM, as indicated at step 74. The fault information may thereafter be stored to an output file to record the following information: pin number; test type; amount of time fault condition was present; whether Malfunction Illuminator Lamp was illuminated; rpm of engine; and recording of any diagnostic codes of the ECM which are set.

With further reference to FIG. 5, if automated operation is not selected by the user, a request is made to determine if manual operation of one or more of the above-described tests is desired, as indicated at step 78. If so, then a request is made to select the desired test (i.e. pin short-to-ground, pin open circuit, or pin short-to-voltage), as indicated at step 80. A request is then made to select the pin of the ECM connector 20a, as indicated at step 82, and the above-described serial communications program is run, as indicated at step 83, to obtain and clear any fault data from the ECM 20. Thereafter, a request is made, as indicated in step 84, as to whether or not further testing is desired. If further testing is desired, then the user is again requested to select the particular ECM pin to be tested, as indicated at step 82. If no further pins are to be tested, the program loops back to inquire if further manual operation is desired, as indicated at step 78.

It will be appreciated that the above flow chart of operation of the program used to control the apparatus 10 could vary considerably in the specific sequence in which inquiries are presented to the user. Accordingly, the program shown in FIG. 5 is intended for illustrative purposes only to indicate one preferred manner in which the apparatus 10 can be controlled to allow for automatic or manual operation, as well as to allow for interrogating the ECM 20.

It will be appreciated then that the apparatus 10 of the present invention forms a relatively low cost, yet simple means by which one of three different fault conditions can be simulated at each pin of each connector on an ECM. The error or fault codes thereafter read from the ECM 20 provide an indication as to whether the ECM properly recognizes the various fault conditions being simulated. In this manner the integrity of the ECM 20 can be checked to ensure that the ECM will recognize and record various fault conditions in the wiring harness 23 or connectors of the wiring harness. The apparatus 10 further does not require a technician or other like individual to remain inside the vehicle or adjacent the engine compartment to implement the three tests described herein. The apparatus 10 can further be controlled easily by any external computer, such as a personal computer, through relatively simple software to automate the tests on the ECM if desired. Since the apparatus 10 uses a well known Centronics® parallel interface, suitable cabling for coupling the apparatus 10 to any external computer equipped with a Centronics® parallel interface card will be readily available.

The apparatus 10 of the present invention significantly reduces the overall time needed to execute the various tests described herein, and is also easy to couple and uncouple from the vehicles electrical system. Since the technician or other like individual executing the test does not need to remain in the vehicle during each test, provided that automated operation is being carried out by an external computer, the individual overseeing the testing is free to perform other tasks. Additionally, when the apparatus 10 is used in the automated mode, the various tests can be executed more rapidly than with other conventional test apparatuses.

Those skilled in the art can now appreciate from the foregoing description that the broad teachings of the present invention can be implemented in a variety of forms. Therefore, while this invention has been described in connection with particular examples thereof, the true scope of the invention should not be so limited since other modifications will become apparent to the skilled practitioner upon a study of the drawings, specification and following claims.

What is claimed is:

1. A diagnostic test apparatus for testing the integrity of an engine controller module (ECM) of a vehicle, said apparatus comprising:

a first test connector for coupling to a connector under test of an ECM;

a second test connector for coupling to a wiring harness of said vehicle to thereby place said apparatus in line between said wiring harness and said connector under test of said ECM;

a parallel port for coupling to an external computer;

a circuit responsive to control signals received at said parallel port for addressing, independently and controllably, one pin at a time of said connector under test; and a plurality of electrical switches responsive to said circuit for selectively simulating at least one wiring harness fault condition of open, short to ground, and short to voltage, at each one of said pins of said connector under test of said ECM, independently, and in accordance with specific ones of said pins addressed by said circuit.

2. The apparatus of claim 1 wherein said plurality of electrical switches are responsive to said circuit for separately simulating the wiring harness fault conditions of open, short to ground, and short to voltage at each one of said pins of said connector under test of said ECM.

3. The apparatus of claim 2 wherein each switch includes first, second and third relays, the first relay coupled in series between an associated one of said pins of said connector under test and an associated one of a plurality of conductors of said wiring harness and responsive to signals from said parallel port to present an open fault condition to said associated one of said pins; the second relay coupled in series between said associated one of said pins of said connector under test and ground and coupled to said first relay and responsive to signals from said parallel port for electrically shorting said associated one of said pins to ground once said first relay is electrically energized to thereby effect a pin short-to-ground fault condition; the third relay coupled in series between said associated one of said pins and a voltage source and coupled to said first relay and responsive to signals from said parallel port for shorting said associated one of said pins of said connector under test to the voltage source to thereby effect a short-to-voltage source fault condition.

4. A diagnostic test apparatus for testing the integrity of an engine controller module (ECM) of a vehicle, said vehicle having a wiring harness which is disconnectable from a connector of said ECM to thereby enable said apparatus to be coupled in line between said wiring harness and said ECM connector, said apparatus comprising:

a first test connector for electrically coupling with said ECM connector;

a second test connector for coupling with a connector of said wiring harness to thereby place said apparatus in line between said ECM connector and said wiring harness of said vehicle;

a parallel port for enabling said apparatus to be coupled to a parallel interface cable of an external computer to receive control signals from said external computer;

a demultiplexer circuit having inputs coupled to said parallel port;

a plurality of first relays coupled to outputs of said demultiplexer circuit such that each one of said first relays is energizable independently of the others in response to a signal at an associated output of said demultiplexer, each one of said first relays being coupled between one pin of said ECM connector and an associated pin of said wiring harness connector to thereby place each said first relay in series in one predetermined circuit line between an associated pin of said ECM connector and an associated pin of said wiring harness connector;

at least one second relay responsive to signals from said parallel port and coupled to each said first relay, a selected one of said first relays and said second relay, when energized simultaneously, operating to short one of said pins of said ECM connector at a time to ground to thereby effect a pin short-to-ground fault condition.

5. The apparatus of claim 4, further comprising a third relay responsive to signals from said parallel port and coupled to each of said first relays, said third relay and said one selected first relay, when energized simultaneously, operating to short a desired one of said pins of said engine controller to a voltage source to thereby simulate to a pin short-to-voltage source fault condition to said ECM.

6. The apparatus of claim 5, wherein said second relay, when not energized, is operable to open the circuit line between the selected one of said pins of said ECM connector and an associated one of said pins of said wiring harness connector when said one selected first relay is energized, to thereby simulate a pin open circuit fault condition to said ECM.

7. A diagnostic test apparatus for performing a plurality of tests on independent pins of a connector of an engine controller module (ECM) of a vehicle, said apparatus comprising:

a parallel port for coupling to a parallel interface of an external computer;

a demultiplexer circuit responsive to signals from said parallel port;

a plurality of first relays each having a first input and a second input, each said first relay being responsive to signals from said demultiplexer circuit;

a first test connector electrically coupled to said first input of each of said first relays and being operable to be coupled to said ECM connector when a wiring harness connector of said vehicle is uncoupled from said ECM connector;

a second test connector coupled to said inputs of each of said first relays and adapted to be coupled with said wiring harness connector of said vehicle to thereby place each of said first relays in series with said pins of said ECM connector and said wiring harness connector;

at least one second relay responsive to signals from said parallel interface and coupled to each of said first relays;

said second relay, when energized concurrently with a selected one of said first relays, operating to short a selected one of said pins of said ECM connector associated with said selected one of said first relays to ground to thereby simulate a pin short-to-ground fault condition to said ECM; and at least one third relay responsive to signals from said parallel port and being coupled to each of said first relays and to said second relay;

said third relay being operable to apply a voltage to said selected one of said pins of said ECM connector associated with said selected first relay when said third relay is energized concurrently with said first relay, to thereby simulate a pin short to positive voltage fault condition.

8. The apparatus of claim 7, further comprising a relay driver circuit responsive to signals from said demultiplexer circuit for controllably energizing and de-energizing each of said first relays, said second relay and said third relay, independently of one another.

9. The apparatus of claim 7, wherein said second and third relays are each coupled to each one of said first relays such that when a selected one of said first relays is energized, a plurality of fault conditions are able to be simulated sequentially one after another, on said selected one of said pins of said ECM connector associated with said selected relay, said fault conditions including a pin open circuit condition, a pin short-to-ground condition and a pin short-to-positive voltage condition, depending upon which of said second and third relays is energized.

10. A diagnostic test apparatus for checking the integrity of an engine controller module (ECM) connector of an engine controller in a vehicle, said apparatus comprising:

a parallel input port for enabling said apparatus to be controlled by an external computer;

a demultiplexer circuit having a plurality of inputs coupled to outputs of said parallel port and being responsive to signals transmitted to said parallel port from said external computer;

a plurality of relay driver circuits responsive to signals from outputs of said demultiplexer circuit;

a plurality of first relays coupled to said relay drivers so as to be drivable by said drivers from non-energized to energized states in accordance with signals from said outputs of said demultiplexer circuit; each of said first relays further including a first input, a second input and a third input;

each said first input of each said first relay being coupled to a first test connector adapted to be coupled directly to said ECM connector and each said second input of each said first relay being adapted to be coupled to a wiring harness connector of said wiring harness of said vehicle to thereby place each one of said first relays in series with an associated one of a plurality of pins of said ECM connector and an associated one of a plurality of conductors of said vehicle wiring harness;

a second relay responsive to signals from said parallel port and including a first input coupled to said third input of each said first relay, a second input electrically coupled to said first input thereof; wherein said second input is left in an open circuit condition, and a third input electrically coupled in parallel to said first input thereof and coupled to ground;

said apparatus causing one pin of said ECM connector associated with a selected one of said first relays to be shorted to ground when said selected first relay is energized and said second relay is de-energized; and said apparatus causing said one pin of said ECM connector associated with said selected one of said first relays to be placed in an open circuit condition when said selected first relay is energized and said second relay is de-energized.

11. The apparatus of claim 10, further comprising:

a third relay responsive to signals from said parallel port, said third relay including a first input electrically coupled in parallel to said third input of each one of said first relays and said first input of said second relay, a second input coupled to said first input and maintained in an open circuit condition, and a third input coupled in parallel with said second input and coupled to a positive voltage source;

said third relay operating to couple said positive voltage source to said one pin of said ECM connector when said selected first relay is energized and when said third relay is energized.

12. A method for performing one or more tests on the integrity of a plurality of pins of an engine controller module (ECM) connector of an ECM of a vehicle, wherein the vehicle has a wiring harness having a wiring harness connector which may be uncoupled from the ECM connector, the method comprising the steps of:

providing a parallel communications port adapted to interface with a parallel port of an external computer so as to enable selection of a plurality of integrity tests to be initiated manually by a user from an external computer;

placing a plurality of independent relays in line between each pin of said ECM connector and each circuit line of said wiring harness such that each said relay is placed in series between an associated one of said pins of said ECM connector and an associated one of said circuit lines of said wiring harness;

controlling said first relays independently of one another in accordance with signals transmitted to said parallel port from said external computer so as to controllably energize and de-energize each one of said first relays for a predetermined length of time;

using at least one second relay in connection with each of said first relays to cause each one of said pins of said ECM connector to be controllably shorted to ground in response to control signals applied to said second relay by said external computer via said parallel communications port.

13. The method of claim 12, further comprising the step of:

using at least one third relay to apply a positive voltage controllably to each one of said pins of said ECM connector when said third relay is energized by a signal from said external computer via said parallel port.

14. The method of claim 13, further comprising the step of:

using said second relay to hold each one of said pins of said ECM in an open circuit condition in response to signals from said external computer applied to said second relay via said parallel port.

15. The method of claim 13, further comprising the step of using said second relay to cause each said pin of said ECM connector to be open circuited, one at a time, as each said first relay is energized.

* * * * *